United States Patent
Kong et al.

(10) Patent No.: US 9,960,185 B2
(45) Date of Patent: May 1, 2018

(54) BASE AND MANUFACTURING METHOD THEREOF, DISPLAY DEVICE

(71) Applicant: BOE Technology Group Co., Ltd., Beijing (CN)

(72) Inventors: Xiangyong Kong, Beijing (CN); Fengjuan Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 52 days.

(21) Appl. No.: 14/654,329

(22) PCT Filed: Sep. 30, 2014

(86) PCT No.: PCT/CN2014/087894
§ 371 (c)(1),
(2) Date: Jun. 19, 2015

(87) PCT Pub. No.: WO2015/192538
PCT Pub. Date: Dec. 23, 2015

(65) Prior Publication Data
US 2016/0268314 A1    Sep. 15, 2016

(30) Foreign Application Priority Data

Jun. 16, 2014  (CN) .......................... 2014 1 0268289

(51) Int. Cl.
*H01L 23/48*    (2006.01)
*H01L 21/4763*    (2006.01)
(Continued)

(52) U.S. Cl.
CPC ...... *H01L 27/1218* (2013.01); *H01L 21/2855* (2013.01); *H01L 21/32051* (2013.01);
(Continued)

(58) Field of Classification Search
CPC ......... H01L 21/02178; H01L 21/02244; H01L 21/02247; H01L 21/32133;
(Continued)

(56) References Cited

U.S. PATENT DOCUMENTS

2011/0012266 A1* 1/2011 Horiuchi ............... H01L 21/561
257/773
2011/0263102 A1* 10/2011 Heikman ............ H01L 29/7787
438/478
2013/0089975 A1    4/2013 Onuki et al.

FOREIGN PATENT DOCUMENTS

CN           1961408 A      5/2007
CN         102033370 A      4/2011
(Continued)

OTHER PUBLICATIONS

May 31, 2016—(CN)—Third Office Action Appn 201410268289.5 with English Tran.
(Continued)

*Primary Examiner* — Hung Vu
(74) *Attorney, Agent, or Firm* — Banner & Witcoff, Ltd.

(57) ABSTRACT

A base and a manufacturing method thereof and a display device are provided, so that a problem of faultage of an insulating layer when forming the insulating layer on an aluminum electrode of a substrate is solved. The base includes an aluminum electrode in a first setting pattern on a substrate, and an aluminum oxide layer or an aluminum nitride layer (3) in a second setting pattern provided in a same layer with the aluminum electrode. The first setting pattern and the second setting pattern are complementary to each other.

16 Claims, 4 Drawing Sheets

(51) Int. Cl.
    *H01L 27/12*         (2006.01)
    *H01L 29/41*         (2006.01)
    *H01L 21/285*       (2006.01)
    *H01L 21/3205*     (2006.01)
    *H01L 21/3213*     (2006.01)
    *H01L 29/45*         (2006.01)
    *H01L 29/49*         (2006.01)
    *H01L 51/52*         (2006.01)
    *H01L 51/56*         (2006.01)
    *H01L 21/02*         (2006.01)

(52) U.S. Cl.
    CPC ...... *H01L 21/32133* (2013.01); *H01L 27/124* (2013.01); *H01L 27/1259* (2013.01); *H01L 29/41* (2013.01); *H01L 29/45* (2013.01); *H01L 29/495* (2013.01); *H01L 29/4908* (2013.01); *H01L 51/5206* (2013.01); *H01L 51/5221* (2013.01); *H01L 51/56* (2013.01); *H01L 21/02178* (2013.01); *H01L 21/02244* (2013.01); *H01L 21/02247* (2013.01); *H01L 21/02255* (2013.01); *H01L 2251/301* (2013.01); *H01L 2251/558* (2013.01)

(58) Field of Classification Search
    CPC ............. H01L 21/32051; H01L 27/124; H01L 27/1218; H01L 27/1259; H01L 29/4908; H01L 29/495; H01L 29/45; H01L 51/5206; H01L 51/5221; H01L 51/56
    USPC ................................. 257/773; 438/618, 666
    See application file for complete search history.

(56) References Cited

FOREIGN PATENT DOCUMENTS

| | | |
|---|---|---|
| CN | 103048840 A | 4/2013 |
| CN | 103489922 A | 1/2014 |
| CN | 103839794 A | 6/2014 |

OTHER PUBLICATIONS

Mar. 25, 2015—International Search Report and Written Opinion with Eng Tran.
Jun. 3, 2015—(CN)—First Office Action for Appn 201410268289.5 with Eng Tran.
Dec. 30, 2015—(CN)—Second Office Action Appn 201410268289.5 with English Tran.
Oct. 8, 2016—(CN) Fourth Office Action Appn 201410268289.5 with English Tran.

\* cited by examiner

BASE AND MANUFACTURING METHOD THEREOF, DISPLAY DEVICE

The application is a U.S. National Phase Entry of International Application No. PCT/CN2014/087894 filed on Sep. 30, 2014, designating the United States of America and claiming priority to Chinese Patent Application No. 201410268289.5 filed on Jun. 16, 2014. The present application claims priority to and the benefit of the above-identified applications and the above-identified applications are incorporated by reference herein in their entirety.

TECHNICAL FIELD

Embodiments of the present disclosure relate to a base and a manufacturing method thereof, and a display device.

BACKGROUND

In the field of display technology, display devices of large-size, high-resolution and high-definition, such as liquid crystal displays and organic light emitting displays, has dominated the current market of flat panel displays.

The display panel includes a variety of electrodes, such as a gate electrode, a source electrode, a drain electrode of a thin film transistor (TFT), a gate line connected to the gate electrode, a data line connected to the source electrode, and a pixel electrode connected to a drain electrode in the display panel.

In current display panels, such as a liquid crystal display panel (LCD) and organic light emitting display panel (OLED), aluminum electrodes are formed typically by using an aluminum material which has lower cost, better conductivity and smaller diffusibility of metal ions. Typically, an insulating layer is formed between the aluminum electrode and other electrodes so that they are insulated from each other.

SUMMARY

Embodiments of the present disclosure provide a base and a manufacturing method thereof and a display device, so that a problem of faultage of an insulating layer when forming an insulating layer on an aluminum electrode of a substrate is solved.

A base provided by at least one of embodiments of the present disclosure comprises an aluminum electrode in a first setting pattern on a substrate; and an aluminum oxide layer or an aluminum nitride layer in a second setting pattern provided in a same layer with the aluminum electrode; wherein the first setting pattern and the second setting pattern are complementary to each other.

In an example, the height difference between the aluminum electrode and the aluminum oxide layer or aluminum nitride layer is in a range of 0-700 nm.

In an example, the aluminum oxide layer or the aluminum nitride layer has a thickness in a range of 100-300 nm, and the aluminum electrode has a thickness in a range of 300-800 nm.

In an example, the base further comprises an insulating layer located on the aluminum electrode and the aluminum oxide layer or the aluminum nitride layer.

In an example, the aluminum electrode comprises at least one of a gate electrode, a source electrode, a drain electrode, a gate line, a data line, a cathode, an anode, and an electrode lead made of aluminum material.

A manufacturing method of a base provided by at least one embodiment of the present disclosure comprising, a step of forming an aluminum electrode in a first setting pattern on a substrate, and a step of forming an aluminum oxide layer or an aluminum nitride layer in a second setting pattern provided in a same layer with the aluminum electrode on the substrate; wherein the first setting pattern and the second setting pattern are complementary to each other.

In an example, the forming of the aluminum electrode and the aluminum oxide layer or the aluminum nitride layer comprises: forming an aluminum layer of a first setting thickness on the substrate; forming a protective layer on a region where an aluminum electrode to be formed on the aluminum layer, and exposing regions of the aluminum layer other than the region with the protective layer; and annealing the substrate with the protective layer in an oxygen or nitrogen annealing equipment by an annealing process, the exposed region of the aluminum layer forms the aluminum oxide layer or the aluminum nitride layer, and the region of the aluminum layer under the protective layer forms the aluminum electrode.

In an example, the manufacturing method further comprises removing the protective layer on the aluminum layer.

In an example, after forming the protective layer and before annealing, an etching process is performed to the exposed aluminum layer so that the region of the aluminum layer in a first setting thickness is etched into the region of the aluminum layer in a second setting thickness.

In an example, the height difference between the aluminum layer in the first setting thickness and the aluminum layer in the second setting thickness is in a range of 0-700 nm.

In an example, the first setting thickness is in a range of 300-800 nm, and the second setting thickness in a range of 100-300 nm.

In an example, the annealing process is performed under temperature of 150-450° C. for 30-180 min.

In an example, the forming of the protective layer on the aluminum layer and exposing the regions of the aluminum layer other than the region with the protective layer comprise: forming a molybdenum layer on the aluminum layer by a film forming process, leaving a portion of the molybdenum layer corresponding to a region where an aluminum electrode to be formed, removing other portions of the molybdenum layer in other regions, and exposing other regions of the aluminum layer other than the region of the aluminum layer corresponding to the protective layer.

In an example, forming an insulating layer on the aluminum electrode and the aluminum oxide layer or the aluminum nitride layer, after forming of the aluminum electrode and the aluminum oxide layer or the aluminum nitride layer.

In an example, the first setting pattern is at least one of a gate electrode pattern, a source electrode pattern, a drain electrode pattern, a gate line pattern, a data line pattern, a cathode pattern, an anode pattern and an electrode lead pattern.

At least one of embodiments of the present disclosure also provides a display device comprising the base provided by any abovementioned manner.

BRIEF DESCRIPTION OF THE DRAWINGS

Embodiments of the present disclosure will be described in detail hereinafter in conjunction with accompanying drawings to allow one of ordinary skill in the art to understand the present disclosure more clearly, in which.

DETAILED DESCRIPTION

Figure 1:
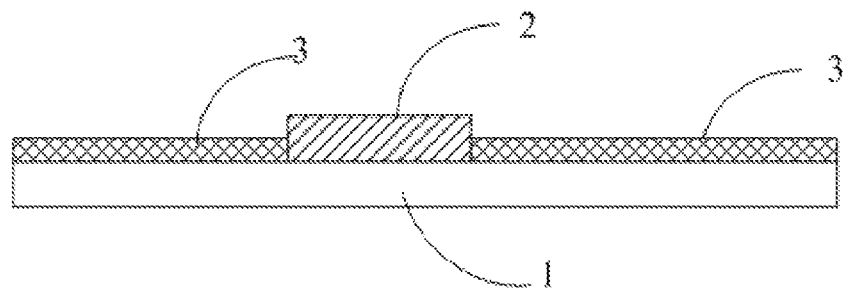
FIG. 1 is a schematic cross-section view of a base according to an embodiment provided by the present disclosure.

Technical solutions according to the embodiments of the present disclosure will be described clearly and completely as below in conjunction with the accompanying drawings of embodiments of the present disclosure. It is apparent that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

Typically, conductivity of an aluminum electrode can be improved by reducing sheet resistance of an aluminum electrode; however, since the sheet resistance and the thickness of an electrode are inversely proportional, the thickness of an aluminum electrode needs to be increased to improve conductivity of an aluminum electrode. It is necessary to minimize the thickness of an insulating layer between electrodes so as to improve electrical performance of a device (e.g., to increase switching current of a TFT) where the electrode lies. An insulating layer is likely to present defective faultage at an edge step of an aluminum electrode when a thinner insulating layer is formed on a thicker aluminum electrode. Once faultage occur in the insulating layer, some portion of the aluminum electrode would be exposed outside, which causes the aluminum electrode to be electrically connected with other electrodes on the insulating layer, resulting in negative effects.

Embodiments of the present disclosure provide a base and manufacturing method thereof and a display device, so that a problem that an insulating layer presents faultage when forming an insulating layer on an aluminum electrode of a substrate is resolved.

The insulating layer has an area which is larger than that of the aluminum electrode and completely covers the aluminum electrode.

The aluminum electrode on the substrate is a pattern structure of a thickness, and a step is formed between an edge of the aluminum electrode and the substrate. The insulating layer is a film layer of relatively thin which serves as insulation. The insulating layer is formed on and conforms to surface shape of the substrate and the aluminum electrode, thus a film layer with a curved shape in part is formed, which has relatively large curvature at the step. When the height difference between the substrate and the aluminum electrode is larger, the insulating layer has a larger curvature at the step between the substrate and the aluminum electrode, and faultage may easily occur. And faultage is more likely to occur when the thickness of the insulating layer is thinner. Embodiments of the present disclosure provide following solutions to resolve the problem of faultage of the insulating layer on the aluminum layer.

A base and a manufacturing method thereof and a display device provided by embodiments of the present disclosure will be described in detail hereinafter in conjunction with accompanying drawings.

Figure 2:
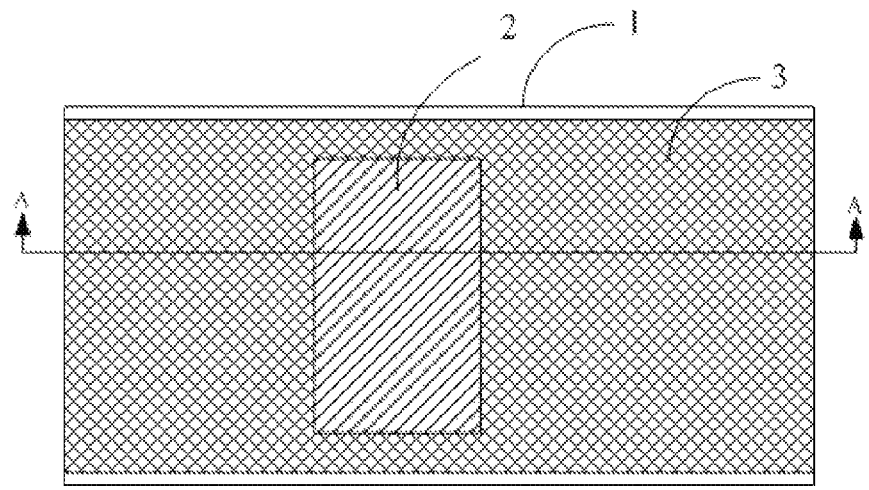
FIG. 2 is a schematic top view of a base according to an embodiment provided by the present disclosure.

FIG. 2 shows a top view of a base according to an embodiment of the present disclosure, and FIG. 1 is a cross-section view in A-A direction of a base in FIG. 2. The base includes: an aluminum electrode 2 in a first setting pattern located on a substrate 1; and an aluminum oxide layer or an aluminum nitride layer 3 in a second setting pattern provided in a same layer with the aluminum electrode 2. The first setting pattern and the second setting pattern are complementary to each other.

The aluminum electrode 2 includes at least one of a gate electrode, a source electrode, a drain electrode, a gate line connected to the gate electrode, a data line connected to the source electrode, an anode and a cathode in a OLED, and an electrode lead in the display technology, which are made of aluminum material. The substrate can be any substrate configured to form the aluminum electrode thereon. For example, the substrate can be a substrate including other function film layers, or a substrate having no any function film layers, such as a glass base. For example, for a gate electrode being an aluminum electrode, for a bottom-gate type of TFT, the gate electrode can be directly formed on a glass base or provided on a glass base with a buffer layer and for a top-gate type of TFT, the gate electrode is formed on a glass base which has already formed with film layers, such as a source electrode, drain electrode, and an active layer. A substrate is defined with respect to a gate electrode, and any structure in addition to the gate electrode can be considered as substrate.

The base may be any kind of bases for display, such as a color film substrate formed with an aluminum electrode, an array substrate or a touch screen.

In the embodiments of the present disclosure described above, pattern of the aluminum electrode 2 and pattern of the aluminum oxide layer or the aluminum nitride layer 3 are complementary to each other, so that there is no gap between the aluminum electrode 2 and the aluminum oxide layer or the aluminum nitride layer 3. In such a way, the insulating layer on the aluminum electrode 2 will not present faultage due to the gap. The film layer provided in a same layer with the aluminum electrode 2 is the aluminum oxide layer or the aluminum nitride layer 3, and the aluminum oxide layer or the aluminum nitride layer 3 is an insulating layer, so that the first setting pattern of the aluminum electrode 2 is allowed.

In an above-mentioned base according to the embodiments of the present disclosure, the film layer provided in the same layer with the aluminum electrode 2 is an aluminum oxide layer or an aluminum nitride layer 3, which enables the aluminum oxide layer or the aluminum nitride layer 3 to be made at a same time with the aluminum electrode 2, and avoids difficulty of etching (dry etching) and difficulty of processing due to forming the insulating layer on the aluminum electrode 2 separately.

Figure 3:
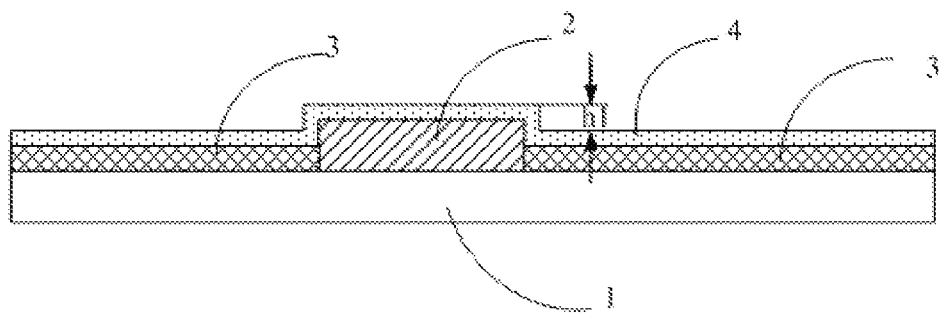
FIG. 3 is a schematic cross-section view of a base with an insulating layer, according to an embodiment provided by the present disclosure.

As shown in FIG. 3, on the basis of the base of FIG. 1, an insulating layer 4 is disposed on the aluminum electrode 2 and the aluminum oxide layer or the aluminum nitride layer 3.

The insulating layer 4 is disposed on a region of the aluminum electrode 2 extending to the region of the aluminum oxide layer or the aluminum nitride layer 3, so that the aluminum electrode 2 is completely covered. The insulating layer 4 is formed on and conforms to surface shape of the aluminum electrode 2 and the aluminum oxide layer or the aluminum nitride layer 3, thus forming a film layer with a flat surface or with a step. When the height of the aluminum electrode 2 and the height of the aluminum oxide layer or the aluminum nitride layer 3 are not equal to each other, the insulating layer 4 has a curved region at an edge of the aluminum electrode 2; when the height of the aluminum electrode 2 and the height of the aluminum oxide layer or the aluminum nitride layer 3 are equal to each other, the insulating layer 4 has a flat surface.

Figure 4:
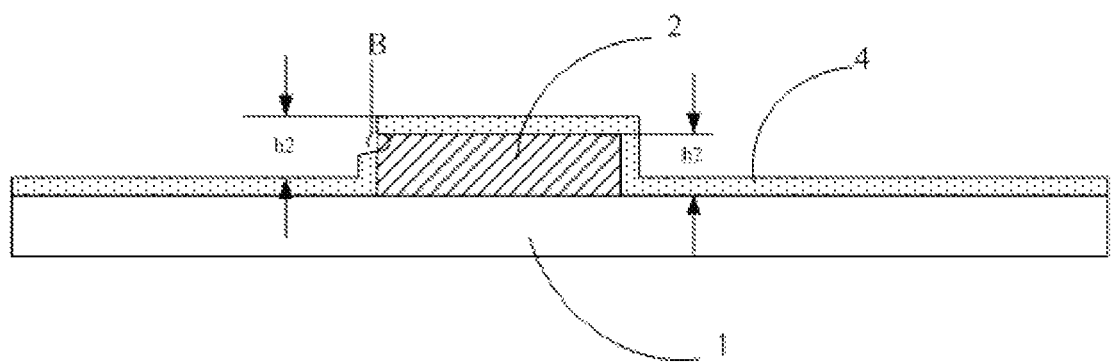
FIG. 4 is a schematic cross-section view of a base provided with an insulating layer.

As a compared example to the above-mentioned embodiment, FIG. 4 shows a common technology of forming an aluminum electrode 2, forming an insulating layer 4 on the aluminum electrode 2, and the insulating layer 4 covers the aluminum electrode 2 and the substrate 1.

Figure 5:
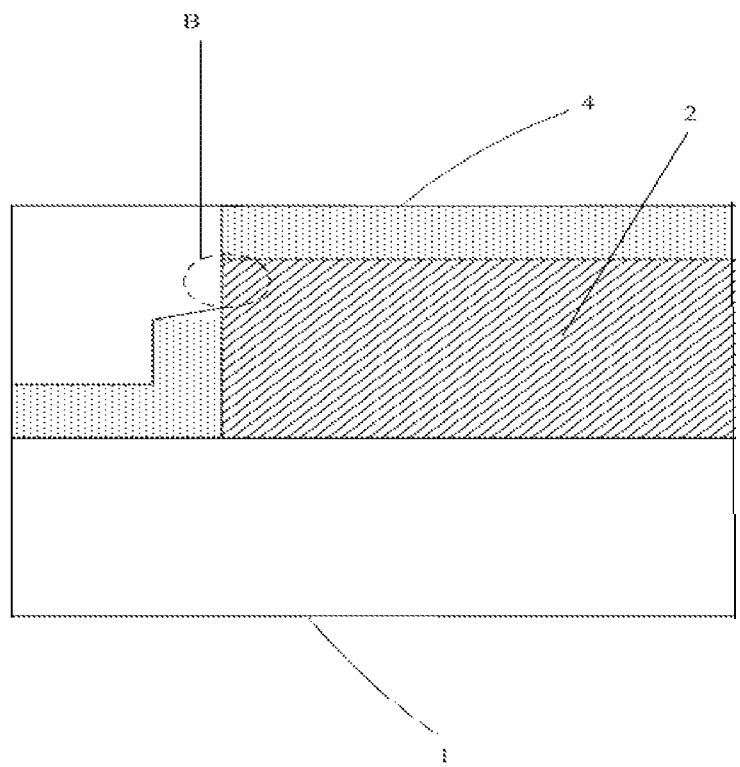
FIG. 5 is a schematic partially enlarged view of a base shown in FIG. 4.

In a base shown in FIG. 3, the height difference between an aluminum electrode 2 and an aluminum oxide layer or an aluminum nitride layer 3 is h1, and the step height of the insulating layer 4 at the edge of the aluminum electrode 2 is also h1. In a base shown in FIG. 4, however, the height difference between an aluminum electrode 2 and an aluminum oxide layer or an aluminum nitride layer 3 is h2, and the step height of the insulating layer 4 at the edge of the aluminum electrode 2 is also h2. Apparently, h1<h2, and the difference of h2 and h1 is equal to the thickness of the aluminum oxide layer or the aluminum nitride layer 3 as shown in FIG. 3. The insulating layer 4 shown in FIG. 3 is formed on the aluminum electrode 2 and the aluminum oxide layer or the aluminum nitride layer 3, and has relatively small curvature at the region corresponding to the edge of the aluminum electrode 2, so that the probability to present faultage is relatively small or it has no risk of faultage. In FIG. 4, however, the insulating layer 4 is formed on the aluminum electrode 2 and the substrate 1, and has relatively large curvature at the region corresponding to the edge of the aluminum electrode 2, so that the probability to present faultage at the region corresponding to the edge of the aluminum electrode 2 is relatively large, particularly when the insulating layer 4 is relatively thin, the insulating layer 4 is very likely to present defect of faultage. FIG. 5 is a schematic structural view of FIG. 4 partially enlarged, including a region of faultage. As we can see from FIG. 5, B region of the aluminum electrode 2 covered by the insulating layer 4 is exposed when the insulating layer 4 presents faultage, and when other conductive film layers are formed on the insulating layer 4, electrical connection will formed through the exposed aluminum electrode 2, resulting to adverse consequences.

That is, compared to the embodiment of forming an insulating layer on the substrate and the aluminum electrode, embodiments of the present disclosure improve the degree of planarization of the insulating layer, reduce the step height of the insulating layer when being partially bent, reduce the probability of occurrence of the faultage and even avoid the occurrence of the faultage.

For example, the height difference of the aluminum oxide layer and the aluminum oxide layer or the aluminum nitride layer is in a range of 0-700 nm, so that the insulating layer of any thickness will not present adverse faultage. That is, it avoids the faultage due to formation of a thin insulating layer on the aluminum electrode.

Typically, the thinner insulating layer has a thickness in a range of 100-500 nm. When the insulating layer is thin, on one hand, it can improve electrical performance of a device, and on the other hand, it can reduce the thickness of the base. For example, when a gate insulating layer is formed on a gate TFT, undesirable faultage can be avoided due to a thinner gate insulating layer, while the thinner gate insulating layer can also improve switching current of the TFT and improve the electrical characteristics of the TFT.

In the base according to embodiments of the present disclosure, the aluminum electrode 2 on the substrate 1 may be higher than, equal to, or lower than the aluminum oxide layer or the aluminum nitride layer 3 on the substrate 1.

According to an example, as shown in FIG. 1, the aluminum electrode 2 on the substrate 1 is higher than the aluminum oxide layer or the aluminum nitride layer 3 on the substrate 1.

Based on the above-described embodiments, the aluminum oxide layer or the aluminum nitride layer has a thickness in a range of 100-300 nm, and the aluminum electrode has a thickness in a range of 300-800 nm. Such design can avoid the faultage of the insulating layer, and the electrode can have low resistivity so as to meet practical application requirements.

Depending on the different requirements of the sheet resistance of the aluminum electrode and the spatial position on the base, the thickness of the aluminum electrode 2 may be designed according to an actual requirement, and the smaller the sheet resistance, the better. The sheet resistance is inversely proportional to the thickness of the electrode, and in order to reduce the sheet resistance of an electrode and to improve the conductivity of the electrode, one can reduce the sheet resistance of the electrode by increasing the thickness of the aluminum electrode.

According to another example, the thickness of the aluminum oxide layer or the aluminum nitride layer 3 is equal to, or approximately equal to the thickness of the aluminum electrode 2, so that surface formed by the aluminum oxide layer or the aluminum nitride layer 3 and the aluminum electrode 2 is almost flat, which allows the thickness of the insulating layer 4 as thin as possible without the risk of faultage.

Based on the above embodiments or examples, those skilled in the art may readily contemplate other embodiments.

Embodiments of the present disclosure also provide a display device including a base of any manner according to the above-described embodiments. The display device may be a product or component with display function, such as a liquid crystal display (LCD) panel, a liquid crystal display, a LCD TV, an organic-light-emitting-display panel, an organic flexible display device, or a mobile phone.

The following description will specifically describe manufacturing method of the base provided by the above-described embodiments.

The manufacturing method includes steps of: forming an aluminum electrode in a first setting pattern on a substrate; and forming an aluminum oxide layer or an aluminum nitride layer in a second setting pattern provided in a same layer with the aluminum electrode on the substrate; wherein the first setting pattern and the second setting pattern are complementary to each other.

Figure 6:
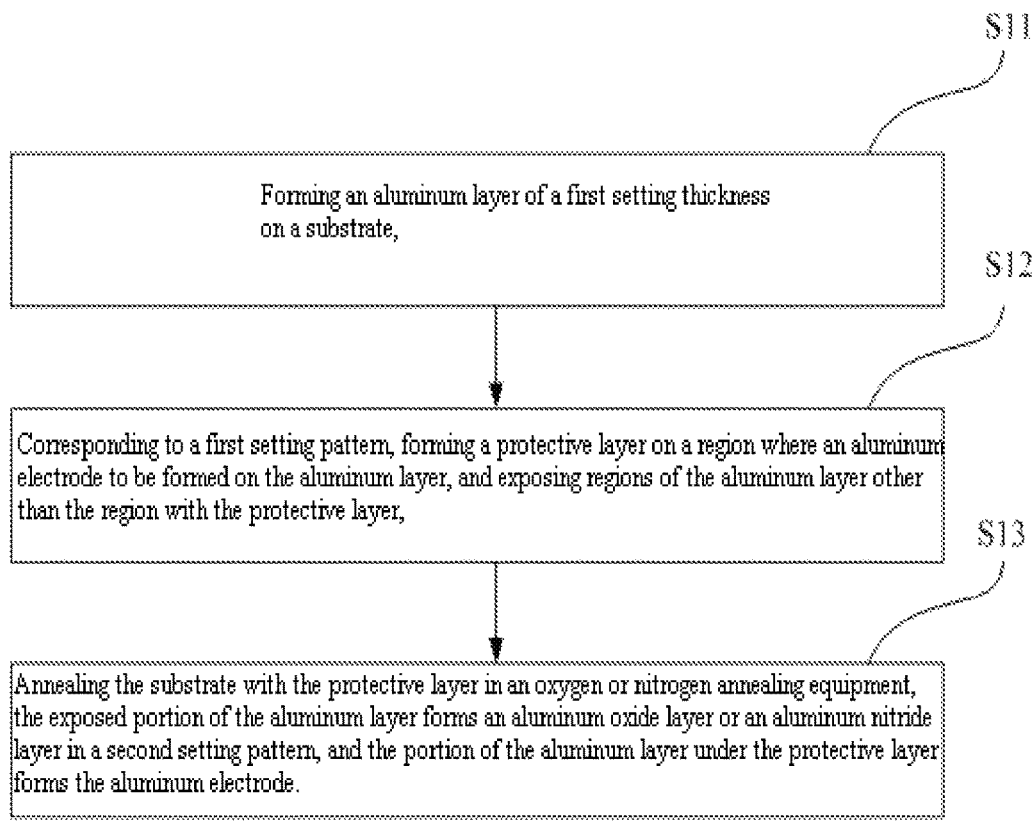
FIG. 6 is a schematic flow chart of a manufacturing method of a base according to an embodiment provided by the present disclosure.

Referring to FIG. 6, the above-described manufacturing method of the base includes steps of:

S11, forming an aluminum layer in a first setting thickness on a substrate,

S12, corresponding to a first setting pattern, forming a protective layer on a region where an aluminum electrode to be formed on the aluminum layer, and exposing regions of the aluminum layer other than the region with the protective layer, S13, annealing the substrate with the protective layer in an oxygen or nitrogen annealing equipment, the exposed region of the aluminum layer forms an aluminum oxide layer or an aluminum nitride layer in a second setting pattern, and the region of the aluminum layer under the protective layer forms the aluminum electrode.

When the protective layer is thin and the thickness of the aluminum electrode and the aluminum oxide layer or the aluminum nitride layer are equal to each other, the curved region on the surface of the insulating layer corresponds to the edge region of the protective layer when the insulating layer is formed on the aluminum electrode, and when the thickness of the protective layer is less than the thickness of the aluminum electrode, the faultage of the insulating layer can be avoided.

For example, the method further includes: removing the protective layer on the aluminum electrode. After removing the protective layer on the aluminum electrode, the insulating layer is disposed on the aluminum electrode and the aluminum oxide layer or the aluminum nitride layer, and when the thickness of the aluminum oxide layer or the aluminum nitride layer is equal to the thickness of the aluminum electrode, tops of them are in a same level, then the insulating layer is a flat film layer and the faultage will not occur.

For example, to allow the exposed aluminum layer to be completely oxidized or nitrided, and insulated from the aluminum electrode, the exposed aluminum layer is processed by an etching process after the protective layer is formed and prior to the annealing treatment, and the first setting thickness aluminum layer is etched to the second setting thickness aluminum layer. The second setting thickness aluminum layer has a smaller thickness than that of the first setting thickness aluminum layer, and will be oxidized or nitrided more completely under same annealing conditions. And based on the premise that the aluminum layer is fully oxidized or nitrided, the annealing time period can be shortened and production efficiency is improved.

For example, the height difference between the first setting thickness aluminum layer and the second setting thickness aluminum layer is in a range of 0-700 nm, so that undesirable faultage will not or hardly occur in the insulating layer.

To allow the height difference between the first setting thickness aluminum layer and the second setting thickness aluminum layer is in a range of 0-700 nm, in an embodiment, for example, the first setting thickness is in a range of 300-800 nm, and the second setting thickness is in a range of 100-300 nm.

For example, the annealing process is performed under a temperature between 150-450° C. for 30-180 min.

In S12, the forming of the protective layer on the aluminum layer and exposing regions of the aluminum layer other than the region with the protective layer include: forming a molybdenum layer on the aluminum layer by a film forming process, patterning the molybdenum layer, leaving a portion of the molybdenum layer corresponding to a region where an aluminum electrode to be formed as a protective layer, removing other portions of the molybdenum layer in other regions, and exposing other regions of the aluminum layer other than the region of the aluminum layer corresponding to the protective layer.

The manufacturing method further includes: forming an insulating layer located on the aluminum electrode and the aluminum oxide layer or the aluminum nitride layer, after the aluminum electrode and the aluminum oxide layer or the aluminum nitride layer are formed.

For example, the first setting pattern is at least one of a gate electrode pattern, a source electrode pattern, a drain electrode pattern, a gate line pattern, a data line pattern, a cathode pattern, an anode pattern and an electrode lead pattern.

The manufacturing method of the base will be described hereinafter with respect to an example that the electrode pattern is a gate pattern and the insulating layer is a gate insulating layer.

Figure 7:
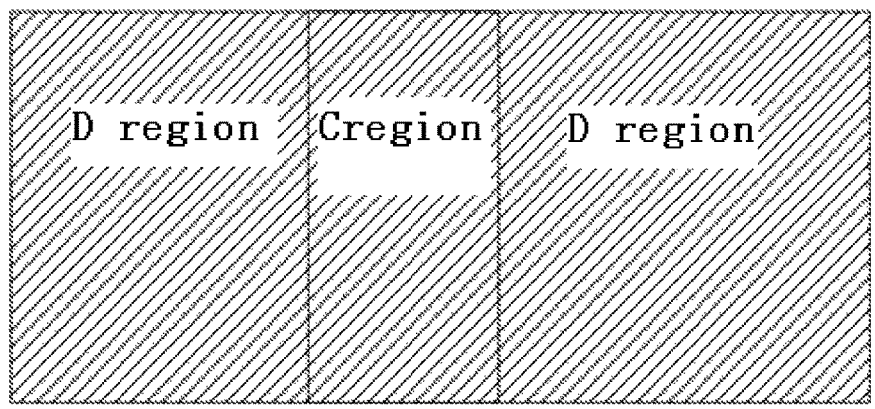
FIG. 7 is a schematic structural view of an aluminum layer having a first region and second regions according to an embodiment provided by the present disclosure.

Step 1: referring to FIG. 7, forming an aluminum layer of the first setting thickness by a depositing or ion sputtering process. The aluminum layer includes a first region (C region) where a gate is to be formed, and second regions (D regions) outside the first region. The thickness of the aluminum layer is about 300-800 nm.

Figure 8:
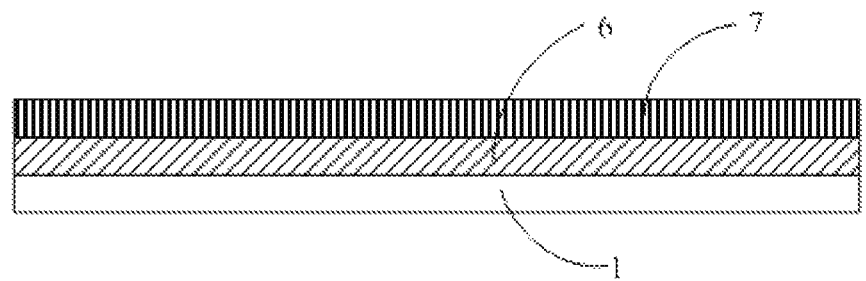
FIG. 8 is a schematic cross-section view of a base formed with an aluminum layer and a molybdenum layer according to an embodiment provided by the present disclosure.

Step 2: referring to FIG. 8, forming a molybdenum layer 7 on the aluminum layer 6 of the substrate 1, the method of forming the molybdenum layer 7 is similar to the method of forming the aluminum layer and will not be described in detail herein.

Figure 9:
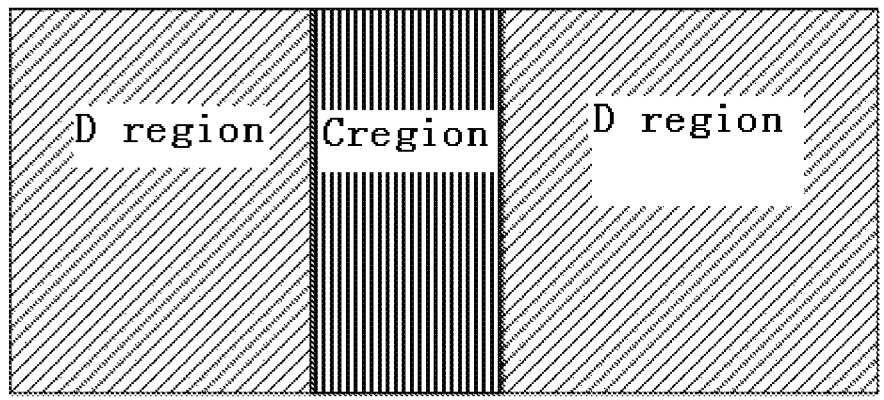
FIG. 9 is a schematic top view of a base with a first region keeping a molybdenum layer and second regions exposing an aluminum layer, according to an embodiment provided by the present disclosure.

Step 3: patterning the aluminum layer 6 and the molybdenum layer 7 shown in FIG. 8 sequentially by a pattern process, i.e. masking, exposing, developing, etching and other processes, leaving the portion of the molybdenum layer 7 corresponding to the first region and remove the portions of the molybdenum layer 7 of the second regions, see FIG. 9.

In order to avoid faultage of the gate insulating layer and allow the aluminum oxide layer or the aluminum nitride layer not too thick to result in incomplete oxidation or nitridation, which may cause electrical connection with the gate electrode, the portions of the aluminum layer of the second regions should not be too thick, otherwise it is difficult to be oxidized or nitrided completely into an insulating layer.

Thus, after the removal of the portions of the molybdenum layer of the second regions, the portions of the aluminum layer of the second regions are etched, and the first setting thickness aluminum layer is etched to the second setting thickness aluminum layer. The second setting thickness is smaller than the thickness of the first setting thickness. Etching may be dry etching or wet etching so that the local etching thickness is consistent. For example, the thickness of the second setting thickness is in a range of 100-300 nm.

Step 4: the substrate after the patterning process is placed in the oxygen or nitrogen annealing equipment, and is annealed under annealing temperature of 150-450° C. for 30-180 min. Since the portions of the aluminum layer of the second regions are exposed to oxygen or nitrogen environment, and the thickness is in the range of 100-300 nm, an aluminum oxide layer or an aluminum nitride layer may be formed completely under above annealing conditions. The aluminum oxide layer or the aluminum nitride layer is an insulating layer. Under the protection of the molybdenum layer, the portion of the aluminum layer of the first region is not oxidized or nitridized such that a conductive gate pattern is formed.

Step 5: removing the portion of the molybdenum layer of the first region, and the exposed electrode pattern is the gate pattern.

Step 6: forming a gate insulating layer on the gate electrode, and the gate insulating layer can cover the entire substrate.

The height difference between the gate electrode and the gate insulating layer is relatively small, which can avoid undesirable faultage of the gate insulating layer. Further, in the above-described process of manufacturing the gate electrode, it is only need to place the base with the aluminum layer in the annealing equipment, and no additional process is needed to form the aluminum oxide layer or the aluminum nitride layer around the gate electrode, and therefore, the manufacturing process of the gate electrode is simplified.

The above manufacturing process of the gate electrode is only illustrative and manufacturing process of other electrodes is similar, which will not be described in detail herein.

The present disclosure provides a base including an aluminum electrode in a first setting pattern located on a substrate, and an aluminum oxide layer or an aluminum nitride layer in a second setting pattern provided in a same layer with the aluminum electrode; wherein the first setting pattern and the second setting pattern are complementary to each other. When an insulating layer is formed on the aluminum electrode with its area larger than the aluminum electrode, the insulating layer is simultaneously formed on the aluminum oxide layer or the aluminum nitride layer, so that the height difference (also referred to as gradient difference) between the substrate and the insulating layer. The curvature of the insulating layer at the region corresponding to the edge of the aluminum electrode is relatively small, avoiding the problem of faultage due to high height difference between the insulating layer and the substrate when forming an insulating layer on the aluminum electrode.

The present disclosure provides a base, and when the aluminum electrode is provided with an insulting layer covering the aluminum electrode, the insulating layer covers the aluminum electrode and the aluminum oxide layer or the aluminum nitride layer provided in a same layer with the aluminum electrode; which improves the overall and local degree of planarization of the insulating layer, avoiding the problem of faultage due to large curvature in local region. During formation of the base, the aluminum electrode and aluminum oxide or nitride layer are formed in a same annealing process, so that the process is simplified.

The above embodiments are only illustrative to the disclosure and not to limit the disclosure. An ordinary person in the art can make various variations and modifications to the present invention without departure from the spirit and the scope of the present invention, and such variations and modifications and equivalent solutions shall fall in the scope of the present invention. The scope of the present invention is defined by the claims.

The present application claims priority of Chinese patent application No. 201410268289.5 filed on Jun. 16, 2014 titled "base and method of manufacturing the same, display device", the entire contents of which are incorporated herein by reference.

What is claimed is:

1. A base, comprising:
    an aluminum electrode in a first setting pattern located on a substrate; and
    an aluminum oxide layer or an aluminum nitride layer in a second setting pattern provided in a same layer with the aluminum electrode,
    wherein the first setting pattern and the second setting pattern are complementary to each other, the aluminum electrode has a height different from that of the aluminum oxide layer or the aluminum nitride layer, and the height difference between the aluminum electrode and the aluminum oxide layer, or between the aluminum electrode and the aluminum nitride layer, is greater than 0 nm and less than or equal to 700 nm.

2. The base according to claim 1, wherein the aluminum oxide layer or the aluminum nitride layer has a thickness in a range of 100-300 nm, and the aluminum electrode has a thickness in a range of 300-800 nm.

3. The base according to claim 2, further comprising an insulating layer located on the aluminum electrode and the aluminum oxide layer or the aluminum nitride layer.

4. The base according to claim 1, further comprising an insulating layer located on the aluminum electrode and the aluminum oxide layer or the aluminum nitride layer.

5. The base according to claim 1, wherein the aluminum electrode comprises at least one of a gate electrode, a source electrode, a drain electrode, a gate line, a data line, a cathode, an anode, and an electrode lead made of aluminum material.

6. A display device comprising the base according to claim 1.

7. A method of manufacturing a base, comprising:
    forming an aluminum electrode in a first setting pattern on a substrate; and
    forming an aluminum oxide layer or an aluminum nitride layer in a second setting pattern provided in a same layer with the aluminum electrode on the substrate,
    wherein the first setting pattern and the second setting pattern are complementary to each other, and the forming of the aluminum electrode and the aluminum oxide layer or the aluminum nitride layer comprises:
        forming an aluminum layer of a first setting thickness on the substrate;
        forming a protective layer on a region where the aluminum electrode is to be formed on the aluminum layer, and exposing regions of the aluminum layer other than the region with the protective layer; and
        annealing the substrate with the protective layer in an oxygen or nitrogen annealing equipment,
    wherein the exposed regions of the aluminum layer form the aluminum oxide layer or the aluminum nitride layer, and the region of the aluminum layer under the protective layer forms the aluminum electrode.

8. The method according to claim 7, further comprising: removing the protective layer on the aluminum electrode.

9. The method according to claim 8, wherein the forming of the protective layer on the aluminum layer, and exposing the regions of the aluminum layer other than the region with the protective layer comprises:
forming a molybdenum layer on the aluminum layer by a film forming process, leaving a portion of the molybdenum layer, corresponding to a region where the aluminum electrode is to be formed, as the protective layer, removing other portions of the molybdenum layer in other regions, and exposing other regions of the aluminum layer other than the region of the aluminum layer corresponding to the protective layer.

10. The method according to claim 7, wherein the annealing is performed under temperature of 150-450° C. for 30-180 min.

11. The method according to claim 7, wherein the forming of the protective layer on the aluminum layer, and exposing the regions of the aluminum layer other than the region with the protective layer comprises:
forming a molybdenum layer on the aluminum layer by a film forming process, leaving a portion of the molybdenum layer, corresponding to a region where the aluminum electrode is to be formed, as the protective layer, removing other portions of the molybdenum layer in other regions, and exposing other regions of the aluminum layer other than the region of the aluminum layer corresponding to the protective layer.

12. The method according to claim 7 further comprising:
forming an insulating layer located on the aluminum electrode and the aluminum oxide layer or the aluminum nitride layer, after forming the aluminum electrode and the aluminum oxide layer or the aluminum nitride layer.

13. The method according to claim 7, wherein the first setting pattern is at least one of a gate electrode pattern, a source electrode pattern, a drain electrode pattern, a gate line pattern, a data line pattern, a cathode pattern, an anode pattern and an electrode lead pattern.

14. A method of manufacturing a base, comprising:
forming an aluminum electrode in a first setting pattern on a substrate; and
forming an aluminum oxide layer or an aluminum nitride layer in a second setting pattern provided in a same layer with the aluminum electrode on the substrate,
wherein the first setting pattern and the second setting pattern are complementary to each other,
wherein the forming of the aluminum electrode and the aluminum oxide layer or the aluminum nitride layer comprises:
forming an aluminum layer of a first setting thickness on the substrate;
forming a protective layer on a region where an aluminum electrode is to be formed on the aluminum layer;
exposing regions of the aluminum layer other than the region with the protective layer; and
etching the exposed regions of the aluminum layer so that a region of the aluminum layer in a first setting thickness is etched into a region of the aluminum layer in a second setting thickness.

15. The method according to claim 14, wherein a height difference between the aluminum layer of a first setting thickness and the aluminum layer of a second setting thickness is in a range of 0-700 nm.

16. The method according to claim 15, wherein the first setting thickness is in a range of 300-800 nm, and the second setting thickness is in a range of 100-300 nm.

* * * * *